United States Patent
Doi et al.

[11] Patent Number: 5,300,482
[45] Date of Patent: Apr. 5, 1994

[54] OXIDE SUPERCONDUCTORS

[75] Inventors: Toshiya Doi, Hitachi; Takaaki Suzuki, Katsuta; Yutaka Yoshida, Hitachi; Atsuko Soeta, Mito; Tomoichi Kamo, Ibaraki; Seizi Takeuchi, Hitachiota, all of Japan

[73] Assignee: Hitachi, Ltd., Tokyo, Japan

[21] Appl. No.: 663,326

[22] Filed: Mar. 1, 1991

[51] Int. Cl.$^5$ ............... H01B 12/00; H01L 39/12; C04B 35/00
[52] U.S. Cl. ................... 505/120; 505/783; 501/123; 501/152; 252/521
[58] Field of Search ............. 505/1, 783; 252/521; 501/123, 152

[56] References Cited

PUBLICATIONS

Huang et al. "Bulk Superconductivity of Thallium Bismuth Calcium Yttrium Strontiun Copper Oxide," *Jap J. App Phy.* Part 2, 28 (9) pp. L1514-L1417, 1989.
Materials Letters, vol. 7, No. 1, 2. Aug., 1988, pp. 1-4.
Japanese Patent Kokai (Laid-Open) No. 1-252538 Sep. 10, 1989.
Science, vol. 24, pp. 249-252 Oct. 1988.
Japan Journal of Applied Physics, vol. 27, pp. L2287-L2288 Dec. 1988.

*Primary Examiner*—Mark L. Bell
*Assistant Examiner*—C. M. Bonner
*Attorney, Agent, or Firm*—Antonelli, Terry, Stout & Kraus

[57] ABSTRACT

This invention provides an oxide superconductor having a composition of the following general formula of $(Tl_aBi_bPb_c)_x(Sr_dBa_e)_{2y}(Ca_fLn_g)_{y(n-1)}Cu_{wn}O_{2n+3+\delta}$, wherein Ln is at least one selected from Y and rare earth elements, n is 2, 3 or 4, $-1<\delta 1$, $0.8 \leq x \leq 1.2$, $0.8 \leq y \leq 1.2$, $0.8 \leq z \leq 1.2$ and $0.8 \leq w \leq 1.2$, and if a, b and c all are not zero, i.e., greater than zero, $a+b+c=1$, $d+e=1$ and $f+g=1$, and $0<a \leq 1$, $0<b \leq 1$, $0<c \leq 1$, $0 \leq d \leq 1$, $0 \leq e \leq 1$, $0.3 \leq f \leq 0.99$ and $0.01 \leq g \leq 0.7$; if b is zero, $a+b+c=1$, $d+e=1$ and $f+g=1$, and $0<a \leq 1$, $0<c \leq 1$, $0<d<1$, $0<e<1$, $0.3 \leq f \leq 0.99$ and $0.01 \leq g \leq 0.7$; if c is zero, $a+b+c=1$, $d+e=1$ and $f+g=1$, and $0<a \leq 1$, $0<b \leq 1$, $0 \leq d \leq 1$, $0 \leq e \leq 1$, $0.3 \leq f \leq 0.99$ and $0.01 \leq g \leq 0.7$; if d and e both are not zero, $a+b+c=1$, $d+e=1$ and $f+g=1$, and $0 \leq a \leq 1$, $0 \leq b \leq 1$, $0 \leq c \leq 1$, $0<d<1$, $0<e<1$, $0.3 \leq f \leq 1.0$ and $0 \leq g \leq 0.7$.

1 Claim, 4 Drawing Sheets

⊕ (B') SITE
○ (A) SITE
⊗ (B) SITE
● (C) SITE
∘ (D) SITE

FIG. 3a
FIG. 3b
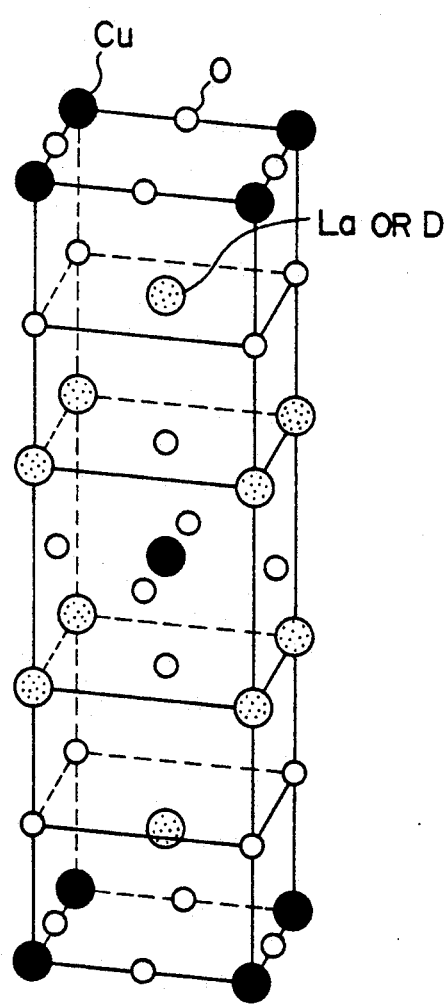
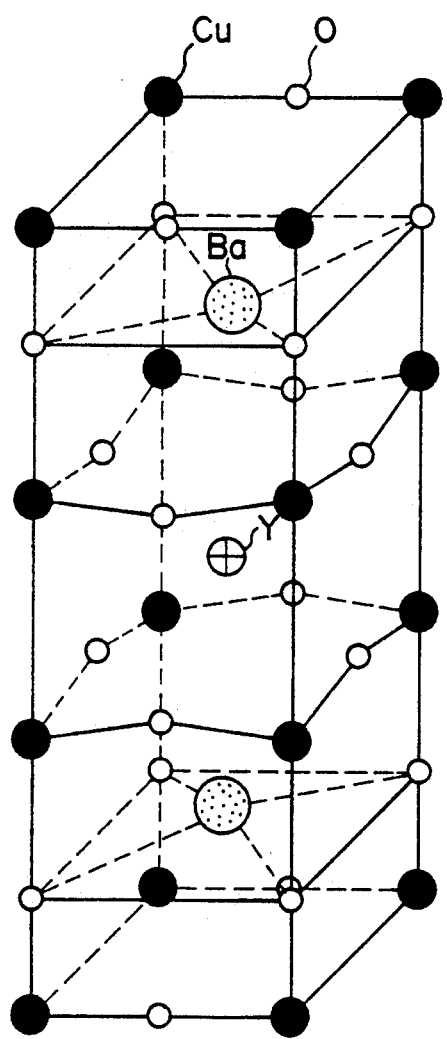

OXIDE SUPERCONDUCTORS

BACKGROUND OF THE INVENTION

Field of the Invention

The present invention relates to new oxide superconductors.

Description of Related Art

Perovskite type copper oxides, such as $K_2NiF_4$ and $La_{\beta-x}BaCuO_4$, exhibiting superconductivity at relatively high temperatures were discovered by Bednortz and Müller in 1986. Thereafter, there have been synthesized various superconductors having a basic structure of perovskite oxide, $ABO\mu$, in which various ions were substituted for the A site ion ($La^{3+}$ and $Ba^{2+}$ in the above oxide) having a large ionic radius. Typical examples of such superconductors are La—Sr—Cu—O (critical temperature Tc: 40K) and Y—Ba—Cu—O (Tc: 90K). As superconductors having a higher critical temperature there were found Ba—Ca—Tl—Cu—O (Tc: 120K) having Tl or Bi substituted for part of Cu at B site, Sr—Ca—Bi—Cu—O (Tc: 105K) and Tl—Sr—Ca—Cu—O (Tc: 110K). The La—Sr—Cu—O or Y—Ba—Cu—O superconductor can relatively easily be synthesized, but unfavorably it has a low critical temperature. Therefore, research is now being focused on the Tl—Ba—Ca—Cu—O, Tl—Sr—Ca—Cu—O and Bi—Sr—Ca—Cu—O systems. New superconductors have been found in sequence among compositions of these systems.

The superconductors recently found are, for example, $Tl_{0.5}Pb_{0.5}Sr_2CaCu_2O_7$ and $Tl_{0.5}Pb_{0.5}Sr_2Ca_2Cu_3O_9$ (see SCIENCE, Vol. 24, 1988, pp. 249–252), $(Tl,Bi)_1(Sr,Ca)_2Cu_1O_{4.5+\delta}$, $TlPbCa_2Sr_2Cu_3O_{9.5}$, $TlPbSr_2CuO_{5.5}$, $TlPbCa_3Sr_4Cu_6O_{15.5}$ and $TlSr_2CuO_{4.5}$ (see Japanese Journal of Applied Physics, Vol. 27, 1988, pp. L2287–L2288), and $(Tl,Bi)_1(Sr,Ca)_2Cu_1O_{4.5+\delta}$ (see MATERIALS LETTERS, Vol. 7, No. 1, 2, August, 1988, pp. 1–4). Further, some superconductors have been proposed by Japanese Patent KOKAI (Laid-Open) No. 1-252538 (Patent Application No. 62-317579) and U.S. Ser. No. 07/385101 filed Jul. 26, 1989.

SUMMARY OF THE INVENTION

The object of the present invention is to provide new superconductors.

In accordance with the present invention, there are provided the composite oxide superconductors having the compositions having the following general formula:

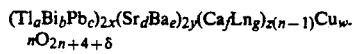
$$(Tl_aBi_bPb_c)_x(Sr_dBa_e)_{2y}(Ca_fLn_g)_{z(n-1)}Cu_{w-n}O_{2n+3+\delta}$$

wherein
Ln is at least one selected from Y and rare earth elements,
n is 2, 3 or 4,
$-1 < \delta < 1$,
$0.8 \leq x \leq 1.2$, $0.8 \leq y \leq 1.2$, $0.8 \leq z \leq 1.2$ and $0.8 \leq w \leq 1.2$,
if a, b and c all are not zero, i.e., greater than zero,
$a+b+c=1$, $d+e=1$ and $f+g=1$, and
$0 < a \leq 1$, $0 < b \leq 1$, $0 < c \leq 1$, $0 \leq d \leq 1$,
$0 \leq e \leq 1$, $0.3 \leq f \leq 0.99$ and $0.01 \leq g \leq 0.7$;
if b is zero,
$a+b+c=1$, $d+e=1$ and $f+g=1$, and
$0 < a \leq 1$, $0 < c \leq 1$, $0 < d < 1$, $0 < e < 1$,
$0.3 \leq f \leq 0.99$ and $0.01 \leq g \leq 0.7$;
if c is zero,
$a+b+c=1$, $d+e=1$ and $f+g=1$, and
$0 < a \leq 1$, $0 < b \leq 1$, $0 \leq d \leq 1$, $0 \leq e \leq 1$,
$0.3 \leq f \leq 0.99$ and $0.01 \leq g \leq 0.7$;
if d and e both are not zero,
$a+b+c=1$, $d+e=1$ and $f+g=1$, and
$0 \leq a \leq 1$, $0 \leq b \leq 1$, $0 \leq c \leq 1$, $0 < d < 1$,
$0 < e < 1$, $0.3 \leq f \leq 1.0$ and $0 \leq g \leq 0.7$; or

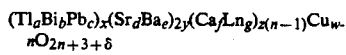
$$(Tl_aBi_bPb_c)_{2x}(Sr_dBa_e)_{2y}(Ca_fLn_g)_{z(n-1)}Cu_{w-n}O_{2n+4+\delta}$$

wherein
Ln is at least one selected from Y and rare earth elements
n is 2, 3 or 4,
$-1 < \delta < 1$,
$0.8 \leq x \leq 1.2$, $0.8 \leq y \leq 1.2$, $0.8 \leq z \leq 1.2$ and $0.8 \leq w \leq 1.2$, and a is substantially not zero,
if a, b and c all are not zero, i.e. greater than zero,
$a+b+c=1$, $d+e=1$ and $f+g=1$, and
$0 < a \leq 1$, $0 < b \leq 1$, $0 < c \leq 1$, $0 < d \leq 1$,
$0 \leq e \leq 1$, $0 \leq f \leq 1.0$ and $0 \leq g \leq 1.0$;
if b is zero,
$a+b+c=1$, $d+e=1$ and $f+g=1$, and
$0 < a \leq 1$, $0 < c \leq 1$, $0 < d < 1$, $0 < e < 1$,
$0 \leq f \leq 1.0$ and $0 \leq g \leq 1.0$;
if c is zero,
$a+b+c=1$, $d+e=1$ and $f+g=1$, and
$0 < a \leq 1$, $0 < b \leq 1$, $0 < d < 1$, $0 < e < 1$,
$0 \leq f \leq 1.0$ and $0 \leq g \leq 1.0$;
if d and e both are not zero,
$a+b+c=1$, $d+e=1$ and $f+g=1$, and
at least two of a, b and c are not zero, and
$0 \leq a \leq 1$, $0 \leq b \leq 1$, $0 \leq c \leq 1$, $0 < d < 1$,
$0 < e < 1$, $0 \leq f \leq 1.0$ and $0 \leq g \leq 1.0$.

BRIEF DESCRIPTION OF THE DRAWINGS

FIGS. 3(a) and 3(b) are diagrammatical views showing the crystal structures of $La_{1-x}D_xCuO_4$ (D: Ba, Sr or Ca) and $YBa_2Cu_3O_{7-\delta}$, respectively.

DETAILED DESCRIPTION OF PREFERRED EMBODIMENTS

Figure 4:
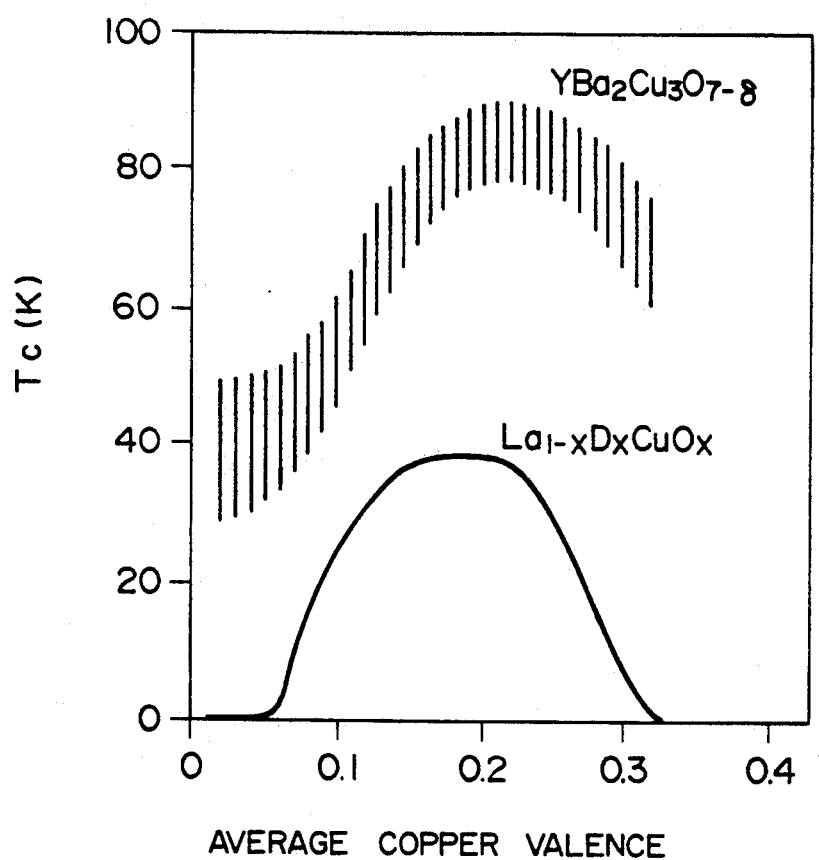
FIG. 4 is a graph showing the average copper valence-critical temperature (Tc) dependencies of $La_{1-x}D_xCuO_4$ and $YBa_2Cu_3O_{7-\delta}$.

The crystal structures of the prior art high-temperature oxide superconductors are summarized in FIGS. 1(a), 1(b), 1(c), 2(a), 2(b), 2(c), 3(a) and 3(b). The superconductors having the structure shown in FIGS. 1(b) and 2(b) have a particularly high critical temperature Tc. The superconductors, $La_{1-x}Ba_xCuO_4$, $La_{1-x}Sr_xCuO_4$ and $La_{1-x}Ca_xCuO_4$ having the structure shown in FIG. 3(a) and the superconductor, $YBa_2Cu_3O_{7-\delta}$ having the structure shown in FIG. 3(b) have the average copper valence-critical temperature dependency as shown in FIG. 4. It is known that in these superconductors there is an optimum average copper valence. The present inventors have found that some superconductors having crystal structures different from those shown in FIGS. 1(a) to 1(c) also have the optimum average copper valence. That is, the present inventors have found that the superconductors obtained by substituting specified ions for the ions occupying the sites of the structures shown in FIGS. 1(a) to (c) under certain conditions also have superconductivity retained. The superconductors having the crystal structures shown in FIGS. 1(a) to 1(c) and 2(a) to 2(c) are occupied by Tl or Bi alone at A and A' sites. However, the present inventors have found that substitution for the ions at these sites of other ions do not change the structures but keep the superconductivity if the average copper valence falls within the range of 2.0 to 2.5, and that substitution for the ions at the other sites of other kinds of ions may afford other superconductors.

The present inventors analyzed the crystal structures of various materials synthesized by substituting the other ion at each of the sites and determined the atomic distance between the copper ion and the oxygen ion constituting a pyramid. It was previously said that the Cu—O bond of the pyramid extending in the plane direction has a great influence on the superconductivity, but according to the present inventors study, it has been found that the distance between the copper ion and the oxygen ion present at the top point of the pyramid has a great influence on the superconductivity, and concretely that the superconductors having the distance of 2.10 to 2.30 Å have very excellent superconductivity.

The superconductors of the present invention are provided in a powdery, lump, thick film or wire form and in a sintered or non-sintered form. The powdery and lump forms are made from starting materials by any one of the known methods. The powder may be molded and sintered, or formed in a thick film by doctor blade. Furthermore, the powder may be molten and rolled to form a tape or ribbon, or packed into a metal pipe and drawn or rolled to form a wire. A thin film of the superconductor according to the present invention may be made with a sputtering, vapor depositing, spraying, laser depositing or MBE (Molecular Beam Epitaxy) or CVD (Chemical Vapor Deposition) method.

In order to obtain the superconductor of the present invention in a powdery form, an oxide mixing method, oxide precipitating method, sol-gel method and etc. may be used.

The temperature of synthesizing superconductors by reacting starting materials varies depending upon the compositions of the materials and the method used but it is preferably in the range of 600° to 1000° C. In general, the reaction at a lower temperature for a longer period of time is required as the number of n is smaller.

High-temperature oxide superconductors having a critical temperature Tc not exceeding 100K, e.g., $La_{1-x}Ba_xCuO_4$, $La_{1-x}Sr_xCuO_4$ and $YBa_2Cu_3O_{7-\delta}$ have been intensively studied on the superconducting mechanism thereof. The superconductors of $La_{1-x}D_x$-$CuO_4$ (D: Ba, Sr or Ca) all have a crystal structure as shown in FIG. 3(a) and can exhibit superconductivity with D being any of Ba, Sr and Ca. The superconductors of $YBa_2Cu_3O_{7-\delta}$ have the crystal structure as shown in FIG. 2(b) and it is known that it can also exhibit superconductivity with any of rare earth elements being substituted for part or whole of Y atom as far as the crystal structure is not greatly changed. From this, it is now believed that appearance of superconductivity in some material depends greatly upon the crystal structure of the material, particularly the plane constituted by Cu atom and O atom and extending vertically to the c-axis of the material. Therefore, the belief has proceeded with search of new superconductors.

On the other hand, it is known that the substitution ratio of D atom in $La_{1-x}D_xCuO_4$ and the deficient amount $\delta$ of oxygen in $YBa_2Cu_3O_{7-\delta}$ cause Tc to be changed. Furthermore, it is now said that Tc is highly relied upon the average copper valence (see FIG. 4).

It is believed that the average copper valence and the crystal structure have a great influence on the superconductivity with the superconductors having the crystal structure as shown in FIGS. 3(a) and 3(b) and having a critical temperature Tc not exceeding 100K. Such influence on the superconductivity of the average copper valence has not been known before the present invention with a series of other superconductors having the crystal structure as shown in FIGS. 1(a) to 1(c) and FIGS. 2(a) to 2(c). The present inventors have found characteristics common to materials exhibiting superconductivity, as a result of their close study on the crystal structure and hole concentration of many superconductors.

The present inventors have found that the ions occupying the A site of the superconductors having the crystal structures as shown in FIGS. 1(a) to 1(c) and FIGS. 2(a) to 2(c) do not contribute to any appearance of superconductivity and, therefore, the ions at A site may be replaced with any kinds of ions.

In accordance with the present invention, the oxygen atoms closest to the cations occupying the B site of the superconductors having the crystal structures as shown in FIGS. 1(a) to 1(c) and FIGS. 2(a) to 2(c) have a great influence on superconductivity. The atoms at B site are preferably replaced with Ba, Sr, Na, K, La or Nd.

Furthermore, in accordance with the present invention, the atoms occupying the B' site should have an ionic radius of 0.90 to 1.0 Å. If the ionic radius is too large, an excess of oxygen is introduced, so that the pyramid constituted by the copper atom and the oxygen atom cannot be formed. If the ionic radius is too small, the crystal structure is changed in a different form. The atoms at B' site are desirably Ca, Y and rare earth elements.

The present invention will be illustrated below with reference to some examples.

EXAMPLE 1

As starting materials were used $Tl_2O_3$, $Bi_2O_3$, SrO, CaO and CuO. These starting materials were mixed together in a Bi:Sr:Ca:Cu atomic ratio of 1:2:1:2. The mixture was fired in air at 880° C. for 100 hours and three times removed from a furnace and cooled during the firing step. With the thus obtained powder was mixed $Tl_2O_3$ in such an amount that a Tl:Bi:Sr:Ca:Cu atomic ratio was 1:1:2:1:2. The resultant mixture was sealed with a gold foil, which was then fired at 870° C. for 50 hours. The X-ray diffraction pattern of the resultant powder revealed that the powder was comprised of a primary phase having a crystal structure as shown in FIG. 1(b). The powder was sintered at 800° C. The electric resistance of the resultant sintered body was determined while decreasing a temperature. The resistance begun to be rapidly lowered in the vicinity of 90K and became zero at 80K.

EXAMPLE 2

A material having a composition of $(Bi_{1-x}A'_x)_2Sr_2Ca_2Cu_3O_y$ was synthesized in such a manner as in Example 1. The Tc of the resultant samples were determined. The results are shown in Table 1. The critical temperature Tc means an onset temperature in a Kelvin scale at which the resistance begins to be rapidly lowered.

TABLE 1

| A' element | Substitution Ratio | | | | |
|---|---|---|---|---|---|
| | 0.1 | 0.3 | 0.5 | 0.7 | 0.9 |
| Tl | 114 | 116 | 118 | 117 | 120 |
| Y | 118 | 117 | — | — | — |
| La | 117 | — | — | — | — |
| In | 115 | 121 | — | — | — |
| Cu | 110 | 101 | — | — | — |
| Ca | 123 | 105 | — | — | — |
| Na | 105 | — | — | — | — |
| Cd | 93 | — | — | — | — |
| Hg | 88 | — | — | — | — |
| Pb | 117 | 120 | 115 | 110 | 107 |

EXAMPLE 3

Starting oxides were mixed so as to obtain a superconductor having a composition of $Bi_2(Sr_{1-x}B_x)_2Ca_2Cu_3O_7$. From the mixture various samples were made. The Tc of these samples was determined. The results are shown in Table 2.

TABLE 2

| B element | Substitution Ratio | | |
|---|---|---|---|
| | 0.1 | 0.5 | 0.1 |
| Ba | 117 | — | — |
| Na | 110 | — | — |
| K | 123 | — | — |
| Rb | 125 | — | — |
| Cs | 107 | — | — |

EXAMPLE 4

Starting oxides were mixed so as to obtain a superconductor having a composition of $Bi_2Sr_2(Ca_{1-x}B'_x)_2Cu_3O_y$ and fired to form samples. The Tc of these samples was determined. The results are shown in Table 3.

TABLE 3

| B' element | Substitution ratio | | | |
|---|---|---|---|---|
| | 0.1 | 0.3 | 0.5 | 1.0 |
| Na | 117 | 108 | 107 | — |
| Y | 105 | 85 | — | — |
| La | 104 | 76 | — | — |
| Nd | 102 | 79 | — | — |
| Er | 100 | 83 | — | — |
| Eu | 103 | 81 | — | — |
| Sm | 98 | 79 | — | — |

EXAMPLE 5

Starting oxides were mixed so as to obtain a superconductor having a composition of $(Tl_{1-x}A'_x)_2Ba_2Ca_2Cu_3O_y$ and fired to form samples. The Tc of these samples was determined. The results are shown in Table 4.

TABLE 4

| A' element | Substitution Ratio | | | | |
|---|---|---|---|---|---|
| | 0.1 | 0.3 | 0.5 | 0.7 | 0.9 |
| Y | 128 | 102 | — | — | — |
| La | 125 | 113 | — | — | — |
| In | 123 | 128 | 60 | — | — |
| Cu | 117 | 70 | 70 | — | — |
| Ca | 129 | 130 | 110 | 100 | — |
| Na | 90 | 70 | — | — | — |
| Cd | 117 | — | — | — | — |
| Hg | 107 | — | — | — | — |
| Pb | 133 | 129 | 125 | 111 | 101 |

EXAMPLE 6

Starting oxides were mixed so as to obtain a superconductor having a composition of $Tl(Ba_{1-x}B_x)_2Ca_2Cu_3O_y$ and fired to form samples. The Tc of these samples was determined. The results are shown in Table 5.

TABLE 5

| B element | Substitution Ratio | | | | |
|---|---|---|---|---|---|
| | 0.1 | 0.3 | 0.5 | 0.7 | 0.9 |
| Sr | 120 | 116 | 117 | 115 | 114 |
| Na | 115 | 43 | 20 | — | — |
| K | 118 | 37 | 21 | — | — |
| Rb | 107 | — | — | — | — |
| Cs | 108 | — | — | — | — |

EXAMPLE 7

Starting oxides were mixed so as to obtain a superconductor having a composition of $(Tl_{1-x}A'_x)_2SrCa_2Cu_3O_y$ and fired to form samples. The Tc of these samples was determined. The results are shown in Table 6.

TABLE 6

| A' element | Substitution Ratio | | | | |
|---|---|---|---|---|---|
| | 0.1 | 0.3 | 0.5 | 0.7 | 0.9 |
| Y | 115 | 80 | — | — | — |
| La | 119 | 102 | — | — | — |
| In | 115 | 117 | — | — | — |
| Cu | 107 | 75 | — | — | — |
| Ca | 115 | 105 | 95 | — | — |
| Na | 98 | — | — | — | — |
| Cd | 95 | 93 | — | — | — |
| Hg | 89 | — | — | — | — |
| Pb | 115 | 117 | — | — | — |

EXAMPLE 8

Figure 1C:
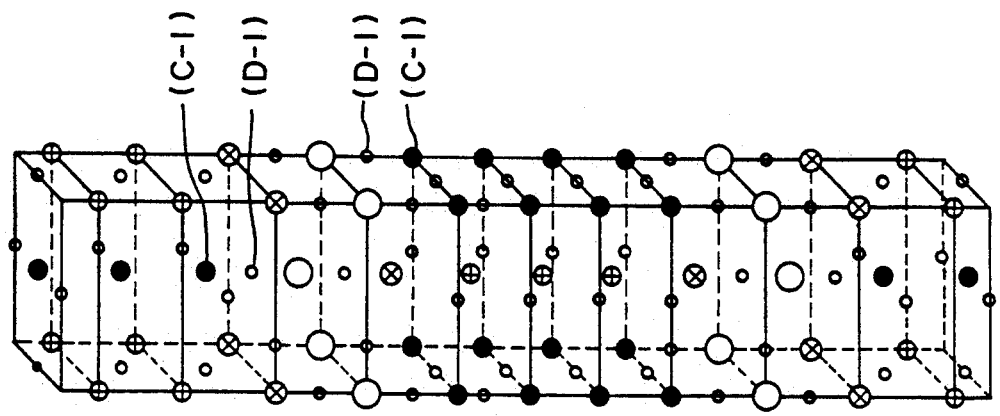
FIGS. 1(a), 1(b) and 1(c) are diagrammatical views showing the crystal, structures of a superconductor having the formula of $A_2B_2B_{n-1}Cu_nO_{2n+4+\delta}$.
Figure 1B:
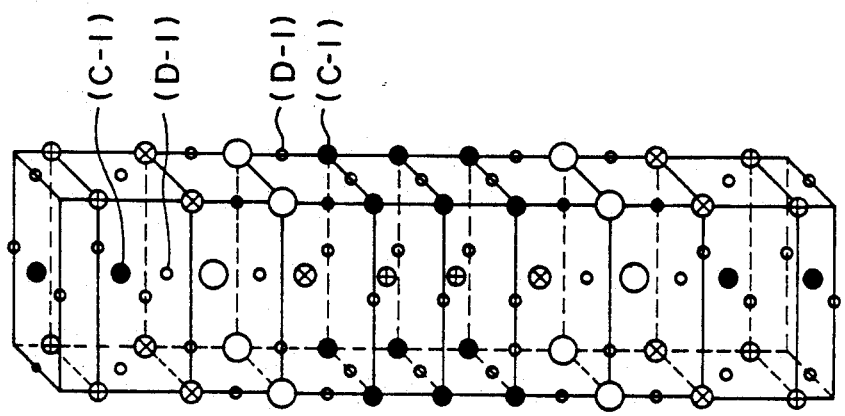
Figure 1A:
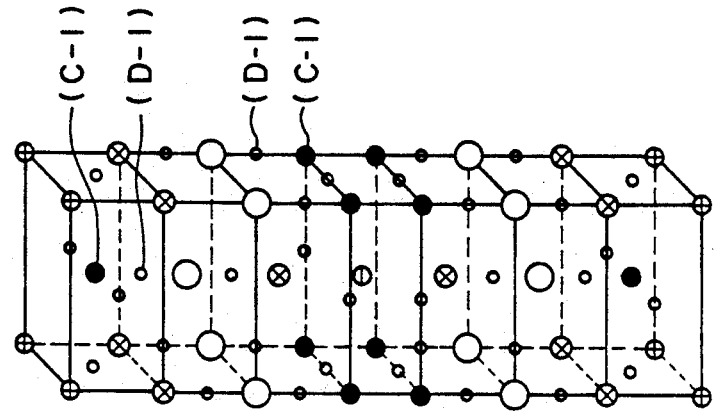

A superconductor having the crystal structure as shown in FIG. 1(c) was synthesized. The Tc thereof was determined. The results are shown in Table 7.

TABLE 7

| Component | Compositional Atomic Ratio | Tc (K) |
|---|---|---|
| Bi/Tl/K/La/Cu | 0.5/0.5/2/2/3 | 102 |
| Bi/Tl/K/Y/Cu | 0.5/0.5/2/2/3 | 110 |
| Tl/Pb/Ba/Ca/Cu | 0.5/0.5/2/2/3 | 132 |
| Tl/Pb/Ba/Y/Cu | 0.2/0.8/2/2/3 | 121 |
| Tl/Pb/K/Y/Cu | 0.5/0.5/2/2/3 | 119 |
| Tl/Pb/Na/Y/Cu | 0.5/0.5/2/2/3 | 115 |
| Tl/Pb/Rb/La/Cu | 0.5/0.5/2/2/3 | 119 |
| Tl/Pb/Ba/Na/Cu | 0.5/0.5/2/2/3 | 107 |
| Tl/Na/Ba/Ca/Cu | 0.9/0.1/2/2/3 | 102 |
| Tl/Na/Sr/Y/Cu | 0.9/0.1/2/2/3 | 114 |
| Tl/Na/Ba/Er/Cu | 0.8/0.2/2/2/3 | 111 |

EXAMPLE 9

Figure 2C:
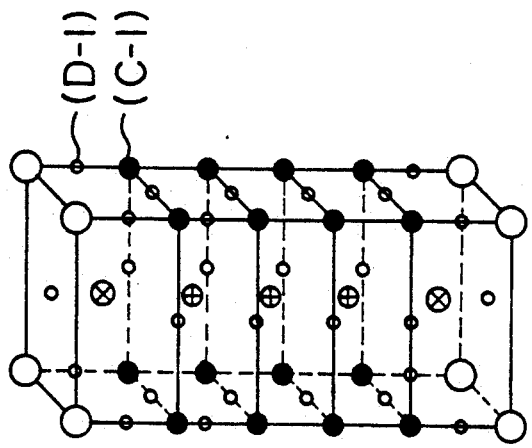
FIGS. 2(a), 2(b) and 2(c) are diagrammatical views showing the crystal structures of a superconductor having the formula of $AB_2B'_{n-1}Cu_nO_{2n+3+\delta}$ (n=2, 3 or 4).
Figure 2B:
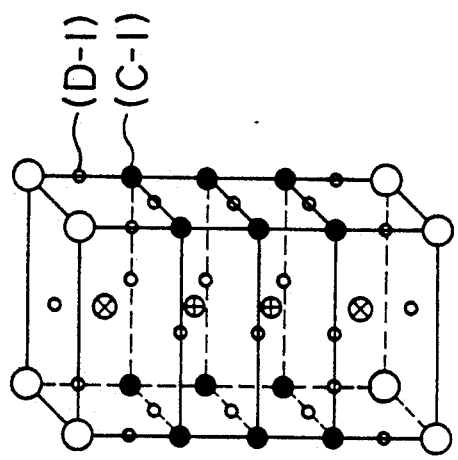

A superconductor having the crystal structure as shown in FIG. 2(c) was synthesized. The Tc thereof was determined. The results are shown in Table 8.

TABLE 8

| Component | Compositional Atomic Ratio | Tc (K) |
|---|---|---|
| Bi/Pb/Na/Y/Cu | 1.6/0.4/2/2/3 | 115 |
| Bi/Na/Sr/Y/Cu | 1.6/0.4/2/2/3 | 110 |
| Bi/Tl/K/La/Cu | 1.0/1.0/2/2/3 | 125 |
| Bi/Tl/K/Y/Cu | 1.0/1.0/2/2/3 | 130 |
| Tl/Pb/Ba/Ca/Cu | 1.5/0.5/2/2/3 | 125 |
| Tl/Pb/Ba/Y/Cu | 1.8/0.2/2/2/3 | 110 |
| Tl/Pb/K/Y/Cu | 1.0/1.0/2/2/3 | 123 |
| Tl/Pb/Na/Y/Cu | 1.0/1.0/2/2/3 | 119 |
| Tl/Pb/Rb/La/Cu | 1.0/1.0/2/2/3 | 121 |
| Tl/Pb/Ba/Na/Cu | 1.0/1.0/2/2/3 | 110 |
| Tl/Na/Ba/Ca/Cu | 1.5/0.5/2/2/3 | 115 |
| Tl/Na/Sr/Y/Cu | 1.5/0.5/2/2/3 | 125 |

TABLE 8-continued

| Component | Compositional Atomic Ratio | Tc (K) |
|---|---|---|
| Tl/Na/Ba/Er/Cu | 1.5/0.5/2/2/3 | 123 |

EXAMPLE 10

Figure 2A:
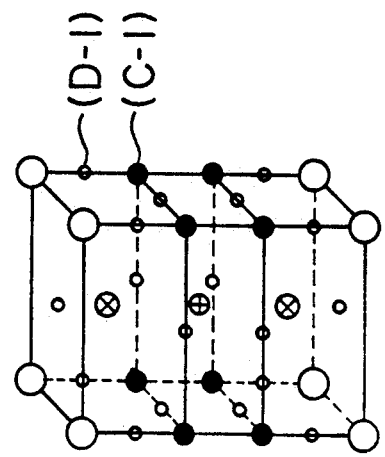

A superconductor having the crystal structure as shown in FIG. 2(a) was synthesized. The Tc thereof was determined. The results are shown in Table 9.

TABLE 9

| Component | Compositional Atomic Ratio | Tc (K) |
|---|---|---|
| Tl/Bi/Pb/Sr/Ba/Ca/Y/Cu | 0.5/0.2/0.3/2.0/0.0/0.9/0.1/2.0 | 113 |
| Tl/Bi/Pb/Sr/Ba/Ca/Y/Cu | 0.5/0.4/0.1/2.0/0.0/0.9/0.1/2.0 | 105 |
| Tl/Bi/Pb/Sr/Ba/Ca/Y/Cu | 0.3/0.3/0.4/2.0/0.0/0.9/0.1/2.0 | 106 |
| Tl/Bi/Pb/Sr/Ba/Ca/Y/Cu | 0.6/0.2/0.2/2.0/0.0/0.9/0.1/2.0 | 107 |
| Tl/Bi/Pb/Sr/Ba/Ca/Y/Cu | 0.6/0.1/0.3/2.0/0.0/0.9/0.1/2.0 | 108 |
| Tl/Bi/Pb/Sr/Ba/Ca/Y/Cu | 0.6/0.1/0.3/2.0/0.0/0.9/0.1/2.0 | 113 |
| Tl/Bi/Pb/Sr/Ba/Ca/Y/Cu | 0.6/0.2/0.2/2.0/0.0/0.9/0.1/2.0 | 109 |
| Tl/Bi/Pb/Sr/Ba/Ca/Y/Cu | 0.6/0.2/0.2/2.0/0.0/0.9/0.1/2.0 | 111 |
| Tl/Bi/Pb/Sr/Ba/Ca/Y/Cu | 0.1/0.3/0.6/2.0/0.0/0.8/0.2/2.0 | 86 |
| Tl/Bi/Pb/Sr/Ba/Ca/Y/Cu | 0.1/0.5/0.4/2.0/0.0/0.8/0.2/2.0 | 92 |
| Tl/Bi/Pb/Sr/Ba/Ca/Y/Cu | 0.8/0.1/0.1/2.0/0.0/0.8/0.2/2.0 | 109 |
| Tl/Bi/Pb/Sr/Ba/Ca/Y/Cu | 0.7/0.1/0.1/2.0/0.0/0.8/0.2/2.0 | 113 |
| Tl/Bi/Pb/Sr/Ba/Ca/Y/Cu | 0.5/0.2/0.3/1.6/0.4/0.8/0.2/2.0 | 112 |
| Tl/Bi/Pb/Sr/Ba/Ca/Y/Cu | 0.5/0.4/0.1/1.2/0.8/0.8/0.2/2.0 | 115 |
| Tl/Bi/Pb/Sr/Ba/Ca/Y/Cu | 0.3/0.3/0.4/1.8/0.2/0.8/0.2/2.0 | 110 |
| Tl/Bi/Pb/Sr/Ba/Ca/Y/Cu | 0.6/0.2/0.2/1.0/1.0/0.8/0.2/2.0 | 103 |
| Tl/Bi/Pb/Sr/Ba/Ca/Y/Cu | 0.6/0.1/0.3/0.6/1.4/0.8/0.2/2.0 | 105 |

EXAMPLE 11

A superconductor having the crystal structure as shown in FIG. 2(b) was synthesized. The Tc thereof was determined. The results are shown in Table 10.

TABLE 10

| Component | Compositional Atomic Ratio | Tc (K) |
|---|---|---|
| Tl/Bi/Pb/Sr/Ba/Ca/Y/Cu | 0.5/0.2/0.3/2.0/0.0/1.8/0.2/3.0 | 133 |
| Tl/Bi/Pb/Sr/Ba/Ca/Y/Cu | 0.5/0.4/0.1/2.0/0.0/1.8/0.2/3.0 | 125 |
| Tl/Bi/Pb/Sr/Ba/Ca/Y/Cu | 0.3/0.3/0.4/2.0/0.0/1.8/0.1/3.0 | 116 |
| Tl/Bi/Pb/Sr/Ba/Ca/Y/Cu | 0.6/0.2/0.2/2.0/0.0/1.8/0.2/3.0 | 117 |
| Tl/Bi/Pb/Sr/Ba/Ca/Y/Cu | 0.6/0.1/0.3/2.0/0.0/1.8/0.2/3.0 | 108 |
| Tl/Bi/Pb/Sr/Ba/Ca/Y/Cu | 0.6/0.1/0.3/2.0/0.0/1.8/0.2/3.0 | 123 |
| Tl/Bi/Pb/Sr/Ba/Ca/Y/Cu | 0.6/0.2/0.2/2.0/0.0/1.8/0.2/3.0 | 119 |
| Tl/Bi/Pb/Sr/Ba/Ca/Y/Cu | 0.6/0.2/0.2/2.0/0.0/1.9/0.1/3.0 | 113 |
| Tl/Bi/Pb/Sr/Ba/Ca/Y/Cu | 0.1/0.3/0.6/2.0/0.0/1.9/0.1/3.0 | 87 |
| Tl/Bi/Pb/Sr/Ba/Ca/Y/Cu | 0.1/0.5/0.4/2.0/0.0/1.9/0.1/3.0 | 92 |
| Tl/Bi/Pb/Sr/Ba/Ca/Y/Cu | 0.8/0.1/0.1/2.0/0.0/1.9/0.1/3.0 | 119 |
| Tl/Bi/Pb/Sr/Ba/Ca/Y/Cu | 0.7/0.1/0.1/2.0/0.0/1.9/0.1/3.0 | 113 |
| Tl/Bi/Pb/Sr/Ba/Ca/Y/Cu | 0.5/0.2/0.3/1.6/0.4/1.9/0.1/3.0 | 111 |
| Tl/Bi/Pb/Sr/Ba/Ca/Y/Cu | 0.5/0.4/0.1/1.2/0.8/1.9/0.1/3.0 | 116 |
| Tl/Bi/Pb/Sr/Ba/Ca/Y/Cu | 0.3/0.3/0.4/1.8/0.2/1.9/0.1/3.0 | 120 |
| Tl/Bi/Pb/Sr/Ba/Ca/Y/Cu | 0.6/0.2/0.2/1.0/1.0/1.9/0.1/3.0 | 113 |
| Tl/Bi/Pb/Sr/Ba/Ca/Y/Cu | 0.6/0.1/0.3/0.6/1.4/1.9/0.1/3.0 | 113 |

EXAMPLE 12

A superconductor having the crystal structure as shown in FIG. 2(c) was synthesized. The Tc thereof was determined. The results are shown in Table 11.

TABLE 11

| Component | Compositional Atomic Ratio | Tc (K) |
|---|---|---|
| Tl/Bi/Pb/Sr/Ba/Ca/Y/Cu | 0.5/0.2/0.3/2.0/0.0/2.5/0.5/4.0 | 125 |
| Tl/Bi/Pb/Sr/Ba/Ca/Y/Cu | 0.5/0.4/0.1/2.0/0.0/2.4/0.6/4.0 | 121 |
| Tl/Bi/Pb/Sr/Ba/Ca/Y/Cu | 0.3/0.3/0.4/2.0/0.0/2.6/0.4/4.0 | 119 |
| Tl/Bi/Pb/Sr/Ba/Ca/Y/Cu | 0.6/0.2/0.2/2.0/0.0/2.3/0.7/4.0 | 109 |
| Tl/Bi/Pb/Sr/Ba/Ca/Y/Cu | 0.6/0.1/0.3/2.0/0.0/2.2/0.8/4.0 | 118 |
| Tl/Bi/Pb/Sr/Ba/Ca/Y/Cu | 0.6/0.1/0.3/2.0/0.0/2.1/0.9/4.0 | 119 |
| Tl/Bi/Pb/Sr/Ba/Ca/Y/Cu | 0.6/0.2/0.2/2.0/0.0/2.5/0.5/4.0 | 119 |
| Tl/Bi/Pb/Sr/Ba/Ca/Y/Cu | 0.6/0.2/0.2/2.0/0.0/2.4/0.6/4.0 | 121 |
| Tl/Bi/Pb/Sr/Ba/Ca/Y/Cu | 0.1/0.3/0.6/2.0/0.0/2.2/0.8/4.0 | 102 |
| Tl/Bi/Pb/Sr/Ba/Ca/Y/Cu | 0.1/0.5/0.4/2.0/0.0/2.3/0.7/4.0 | 95 |

TABLE 11-continued

| Component | Compositional Atomic Ratio | Tc (K) |
|---|---|---|
| Tl/Bi/Pb/Sr/Ba/Ca/Y/Cu | 0.8/0.1/0.1/2.0/0.0/2.6/0.4/4.0 | 119 |
| Tl/Bi/Pb/Sr/Ba/Ca/Y/Cu | 0.7/0.1/0.1/2.0/0.0/2.1/0.9/4.0 | 123 |
| Tl/Bi/Pb/Sr/Ba/Ca/Y/Cu | 0.5/0.2/0.3/1.6/0.4/2.8/0.2/4.0 | 118 |
| Tl/Bi/Pb/Sr/Ba/Ca/Y/Cu | 0.5/0.4/0.1/1.2/0.8/2.4/0.6/4.0 | 111 |
| Tl/Bi/Pb/Sr/Ba/Ca/Y/Cu | 0.3/0.3/0.4/1.8/0.2/2.4/0.6/4.0 | 116 |
| Tl/Bi/Pb/Sr/Ba/Ca/Y/Cu | 0.6/0.2/0.2/1.0/1.0/2.5/0.5/4.0 | 107 |
| Tl/Bi/Pb/Sr/Ba/Ca/Y/Cu | 0.6/0.1/0.3/0.6/1.4/2.6/0.4/4.0 | 115 |

What is claimed is:

1. An oxide superconductor having a composition of the following formula:

$$Tl_a Bi_b Pb_c (Sr_d Ba_e)_2 (Ca_f Ln_g)_{n-1} Cu_n O_{2n+3+\delta}$$

wherein

L is at least one element selected from the group consisting of Y and rare earth elements, n is 2, 3 or 4, and $-1 < \delta < 1$, $0.1 \leq a \leq 0.8$, $0.1 \leq b \leq 0.5$, $0.1 \leq c \leq 0.6$,   $a + b + c = 1$ $0.3 \leq d \leq 1.0$, $0 \leq e \leq 0.7$,   $d + e = 1$ $0.7 \leq f \leq 0.95$ $0.05 \leq g \leq 0.3$   $f + g = 1$.

* * * * *